US007022585B2

(12) United States Patent
Solanki et al.

(10) Patent No.: US 7,022,585 B2
(45) Date of Patent: Apr. 4, 2006

(54) METHOD FOR MAKING THIN FILM DEVICES INTENDED FOR SOLAR CELLS OR SILICON-ON-INSULATOR (SOI) APPLICATIONS

(75) Inventors: Chetan Singh Solanki, Leuven (BE); Renat Bilyalov, Tielt-Winge (BE); Jef Poortmans, Kessel-Lo (BE)

(73) Assignee: Interuniversitair Microelektronica Centrum (IMEC), Leuven (BE)

( * ) Notice: Subject to any disclaimer, the term of this patent is extended or adjusted under 35 U.S.C. 154(b) by 20 days.

(21) Appl. No.: 10/627,576

(22) Filed: Jul. 24, 2003

(65) Prior Publication Data

US 2005/0020032 A1   Jan. 27, 2005

(30) Foreign Application Priority Data

Jul. 24, 2002  (EP)  ................................. 02447146

(51) Int. Cl.
  *H01L 21/46*  (2006.01)
(52) U.S. Cl. ....................................... 438/455; 438/458
(58) Field of Classification Search ................ 438/455, 438/458, 459
  See application file for complete search history.

(56) References Cited

U.S. PATENT DOCUMENTS 5,391,257 A    2/1995  Sullivan et al.
6,211,038 B1   4/2001  Nakagawa et al.
6,258,698 B1   7/2001  Iwasaki et al.
6,326,280 B1  12/2001  Tayanaka
6,500,731 B1 * 12/2002  Nakagawa et al. ......... 438/455
2002/0171080 A1 * 11/2002  Faris ........................... 257/40

FOREIGN PATENT DOCUMENTS

| EP | A-0767486 | 4/1997 |
| EP | A-0993029 | 4/2000 |
| EP | 1 132 952 A | 9/2001 |
| EP | A-1132952 | 9/2001 |

OTHER PUBLICATIONS

S. M. Sze: "Semiconductor Devies Physics and Technology" 1985, John Wiley and Sons, Murray Hill, New Jersey, USA, XP002311145 ISBN: 0-471-87424-8 *p. 441-442 *figure 11.

* cited by examiner

*Primary Examiner*—Tuan H. Nguyen
(74) *Attorney, Agent, or Firm*—Knobbe, Martens, Olson & Bear, LLP (57) ABSTRACT

In one inventive aspect, a thin film device is manufactured by (a) forming a porous semiconductor layer in the form of a thin film on an original substrate, the formation being immediately followed by (b) separation of the thin film by a lift-off process from the original substrate; (c) transfer of the thin film to a dummy support, the thin film not being attached to the dummy support; (d) fabrication of a device on top of the thin film; and (e) transfer and attachment of said device on said thin film on a foreign substrate.

15 Claims, 6 Drawing Sheets

METHOD FOR MAKING THIN FILM DEVICES INTENDED FOR SOLAR CELLS OR SILICON-ON-INSULATOR (SOI) APPLICATIONS

BACKGROUND OF THE INVENTION

1. Field of the Invention

The present invention is related to micro-electronics and more particular to the field of thin film device applications such as silicon-on-insulator (SOI) structures or solar cells in particular. Furthermore, the present invention is relating to a manufacturing method of such devices.

2. Description of Related Technology

The silicon in existing semiconductor devices usually has a thickness of several hundred microns. However, the electrically active domain of a wafer is limited to its surface; in fact, less than a few microns of thickness is needed. The remaining portion of the wafer is used as substrate. Unfortunately, this excess of material causes both a rise in power consumption and a fall in the operating speed of the device. The SOI wafers incorporate an insulating layer between its very thin (less than a few microns) active domain and its much thicker substrate. The substrate is isolated and can thus no longer deteriorate the speed or efficiency of the active layer.

Silicon on insulator technology (SOI) involves the formation of a monocrystalline silicon semi-conductor layer on an insulating material such as silicon oxide.

One important application of a thin film device is the manufacturing of solar cells. Solar cells usually comprise an active surface on the top of a silicon wafer in the form of a thin film device deposited on said silicon wafer.

During the conversion of light into electrical energy, as mentioned above, only the top few microns of said top layer are really active. The major part of this silicon wafer only provides mechanical strength to the device. This function can be achieved by any other low-cost substrate compatible to the production process. The requirements for such a substrate, excepted low cost, are high temperature stability (1100° C.), matching of the thermal expansion coefficients and low impurity contents.

More generally, in the prior art, the preparation of a porous semiconductor layer on a substrate as a sacrificial layer for solar cell usually comprises several steps such as at least a porous semiconductor layer formation on an original substrate, epitaxial silicon layer deposition, device fabrication on said substrate and separation of the device from the original substrate and transfer to a foreign substrate in order to possibly re-use the original substrate. This sequence is largely illustrated in the documents U.S. Pat. No. 6,258,698 (Iwasaki et al, Canon), U.S. Pat. No. 6,211,038 (Nakagawa et al, Canon) and U.S. Pat. No. 6,326,280 (Tayanaka, Sony Corporation).

In the prior art, several methods are known to separate thin (porous) semiconductor films from a substrate. All those methods use a lift-off or peeling-off process at the end of the production chain. The drawback of these methods is that during all the process steps, parameters such as temperature, pressure and chemicals are conditioned by the resistance of the original substrate. The film separation and its transfer is the last technological step that requires preserving the high-porous characteristics of the Si layer. The fact of maintaining said porous characteristics throughout many high-temperature steps allows only a narrow processing window in terms of process temperature and porosity. Moreover in said case, the transfer is difficult to achieve properly.

In particular, a lift-off process is described in EP-A-1132952 where it is shown that a thin porous silicon film of 5 to 50 μm can be separated from the silicon substrate whereon it is deposited. In such case, the substrate can be re-used many times for getting new porous silicon films. Other possible techniques for thin film separation are ion implantation or wafer bonding techniques.

In EP-A-0993029, a method is disclosed for the production of a crystalline semiconductor film. This is done by forming a porous layer on a semiconductor substrate, lifting-off the porous layer, and either before or after the lifting-off applying a thermal annealing step such that the porous layer is at least partially recrystallized. For the lift-off step a method is disclosed in which the porous layer is attached to a 'Hilfsträger', which can be translated as a 'sub-carrier', or a 'foreign substrate'. The porous layer is physically bonded or glued to said foreign substrate.

SUMMARY OF CERTAIN INVENTIVE ASPECTS

Various inventive aspects aim to provide an easy method for the preparation of thin-film devices for structures being highly efficient and low-cost. Examples of such structures are silicon-on-insulator (SOI) structures or solar cells. The use of thin film in SOI structures in general and in solar cells in particular allows the reduction of the amount of material consumed per structure, which significantly reduces the high costs of the active substrate, while the quality of the film provides the good characteristics of the whole device.

Further inventive aspects may reduce the impact of device processing steps on the original substrate, porous silicon layer, porous silicon layer formation, necessary glues and target substrate.

Yet further inventive aspects may improve control on the production-and-transfer process of thin films.

Several documents listed below are incorporated by reference herewith. In particular, the document EP-A-1132952 is hereby incorporated by reference as a whole, especially with respect to the production of the thin porous film.

In the art, the term 'original substrate' has also been named 'mother substrate', 'start-substrate' or 'originating substrate'. The term 'dummy support' in the art can also be named 'intermediate support or substrate', 'support substrate', 'dummy substrate'. The term 'foreign substrate' in the art can also be named 'target substrate', 'final substrate' or 'end-substrate'. The foreign substrate can be any substrate, e.g., glass. More examples of possible substrates are given in EP-A-0767486 and in U.S. Pat. No. 6,391,219, where the final substrate is called support substrate. To avoid any confusion, in the present context, the distinction between the dummy support and the final support is that the dummy support is a support on which the fabrication of a device can easily take place with full freedom of process parameters and/or without a negative impact of any device processing steps on the original substrate, porous silicon layer, porous silicon layer formation, necessary glues and/or target substrate. The dummy support is a support to which the porous layer is transferred intermediately without physical attachment thereto. The dummy substrate provides the necessary support and/or mechanical strength to the porous layer(s) during fabrication thereon of a device. In the absence of such supportive material, the porous layer(s) might break during device fabrication because too fragile.

One aspect of the present invention relates to a method for manufacturing a semiconductor device. The method may comprise the following:

(a) formation of a porous semiconductor layer in the form of a thin film on an original substrate, said formation being immediately followed by the step of (b) separation of said thin film by a lift-off process from said original substrate;

(c) the transfer of said thin film to a dummy support, said thin film not being attached to said dummy support;

(d) fabrication of a device on top of said thin film;

(e) transfer and attachment of said device on said thin film on a foreign substrate.

In one aspect, the method differs from methods known in the art in the sequence of its steps. It further differs from methods in the prior art by the fact that a device is fabricated on the thin film while placed on a support to which the thin film is not physically bonded and/or glued. In other words, the device is fabricated on a free-standing thin film. The advantageous effects that accompany these changes with respect to the prior art are discussed throughout the specification.

How to perform the different steps per se is known in the art. For instance, several possible methods for steps (a) and/or (b) are disclosed in EP-A-0767486, EP-A-0993029, EP-A-1132952, U.S. Pat. No. 6,391,219 and references cited herein. In an embodiment of the present invention, cleaved surfaces may be smoothened before further processing, as described for instance in U.S. Pat. No. 6,391,219. In a preferred embodiment of the invention, the original substrate can be re-used directly and/or be prepared for re-use.

In accordance with the present invention, the fabrication of a device, or at least part thereof, takes place on a free-standing thin film, before transfer of film and device to a final substrate which becomes part of the final thin film device, preferably of low-cost but highly efficient.

Throughout steps (b) to (d), in the present context, the thin film is often referred to as a free-standing film, also after transfer to a dummy substrate in step (c). The term "free-standing" refers to the fact that the film is not attached or physically bonded to the dummy substrate but merely placed or positioned on it, possibly fixed in between two supports to give mechanical strength to the porous semiconductor layer.

The fabricated device to be transferred to the foreign substrate can be a non-finished or intermediate device. Some processing steps to for instance finish the device, in other words to achieve a properly working device, can be performed after bonding of the intermediate device on a foreign substrate. According to aspects of the present invention, at least those processing steps are performed on the free-standing device placed on (but not physically attached to) a dummy support that would otherwise be limited with respect to temperature and/or other process parameters. In a preferred embodiment of the invention, at least an epitaxial active semiconductor layer is fabricated on the free-standing thin device before transfer and attachment to a foreign substrate on which it is then finished.

According to a preferred embodiment of the present invention the steps (c) and (d) are performed twice, such that the repeated step (c) unveils the unprocessed side of the thin film after the first (d) step. In other words steps (c) and (d) can be repeated such that (d) is performed ones on one side of the thin film and ones on the other side of the thin film.

In an advantageous embodiment, the step of the fabrication of a device comprises the deposition of an active semiconductor layer on said thin film. In another embodiment, this formation of a semiconductor layer is further followed by the fabrication of a device, which can be contacted, on said active semiconductor layer. The device may be any suitable device known in the art.

The lift-off process according to the present invention can be achieved by immersing the substrate in a HF solution in concentration between 12 and 35% and using current densities between 50 and 250 mA/cm$^2$ without changing any other parameters.

Preferably, the deposition of the active layer is performed by epitaxial Chemical Vapor Deposition (CVD).

The porous semiconductor layer can be a crystalline or amorphous semiconductor material including silicone germanium, III–V materials such as GaAs, InGaAs and semiconducting polymers, for example.

The foreign substrate can be any substrate. For example, the foreign substrate may comprise a low-cost substrate such as glass or a polymeric material.

DETAILED DESCRIPTION OF CERTAIN INVENTIVE EMBODIMENTS

The widely known silicon on insulator (SOI) technology involves the formation of a monocrystalline semiconductor layer on an insulating material, such as silicon oxide or glass.

Figure 1:
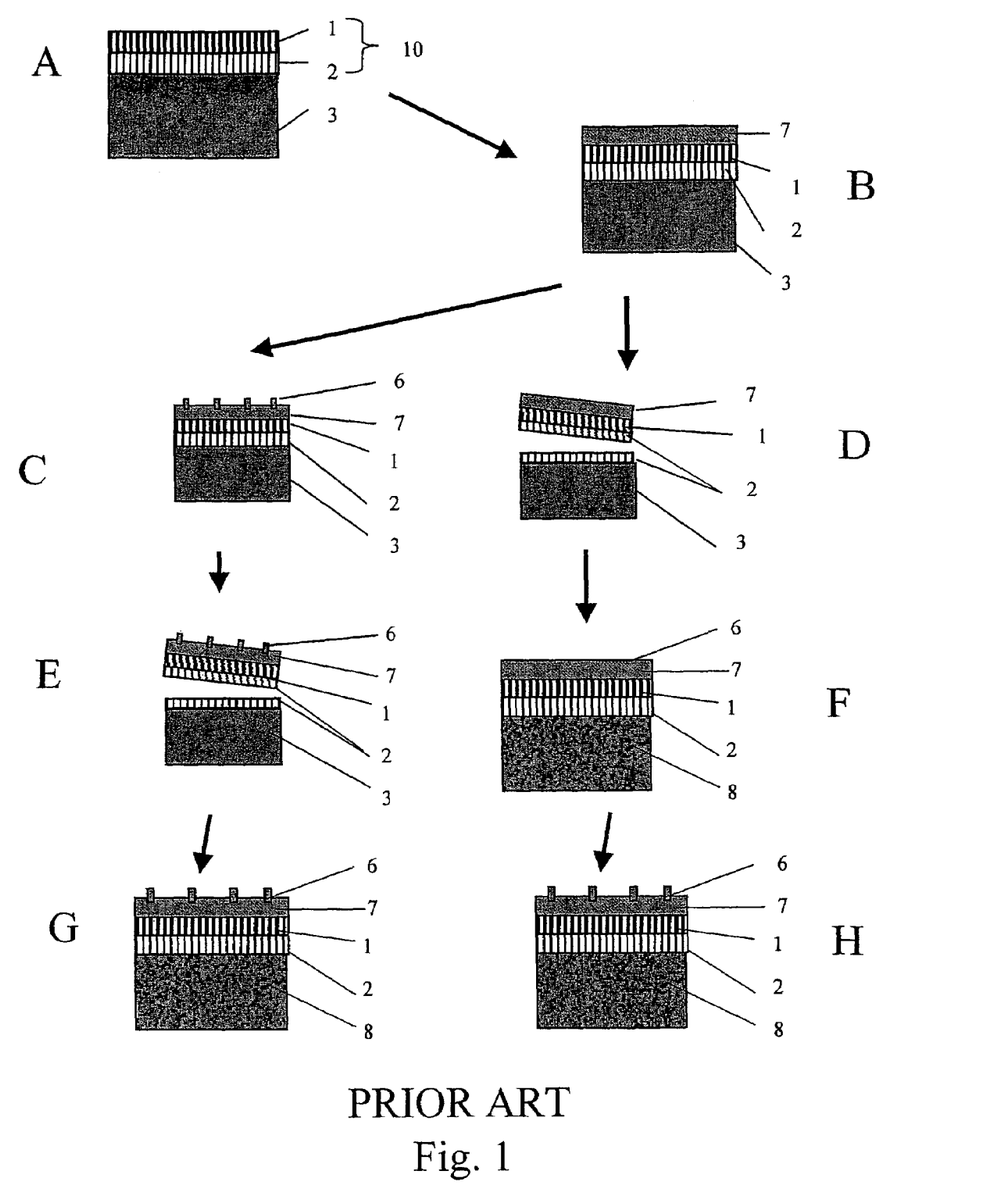
FIG. 1 represents two manufacturing sequences of the prior art for the fabrication of solar cells (PSI process [A-B-C-E-G] and ELTRAN® process [A-B-D-F-H]).
Figure 2:
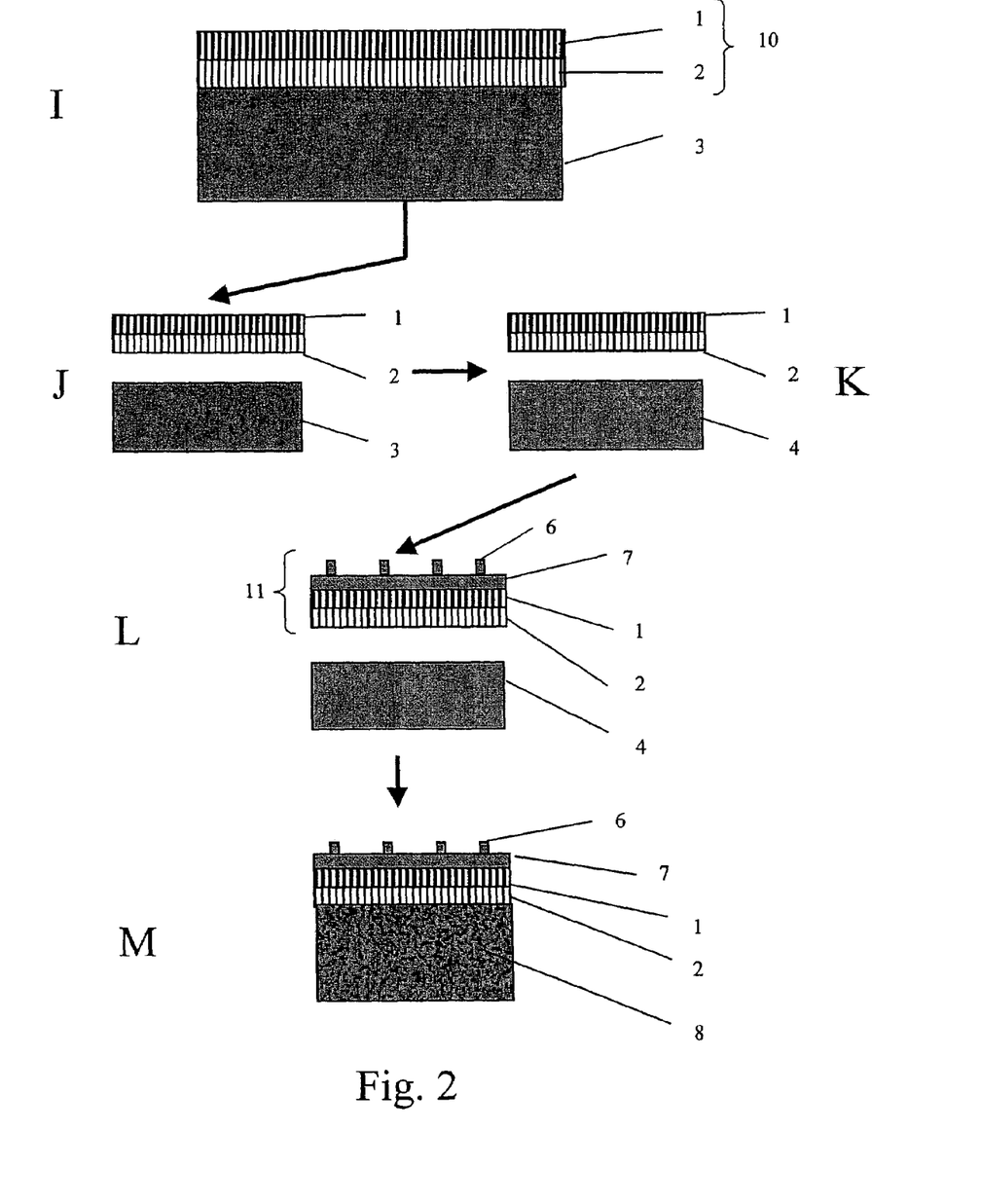
FIG. 2 represents the manufacturing sequence of the present invention for the fabrication of a solar cell.

A particular embodiment of the present invention is related to the fabrication of solar cells which are described in details in FIGS. 1 and 2.

The sequence of the prior art process is described in FIG. 1 while FIG. 2 represents the manufacturing process for the fabrication of a solar cell according to the present invention.

FIG. 1 [A-B-C-E-G] represents, according to the prior art, the preparation of a porous silicon layer (10, double layer 1+2) on a substrate (3) (FIG. 1A) followed by an epitaxial silicon layer (7) deposition (FIG. 1B), fabrication of the contacted device (6) on the substrate (FIG. 1C) and finally the separation of the device, including the epitaxial silicon layer (7) and a portion of the porous silicon layer (10), from the substrate (3) (FIG. 1E) and the transfer to a foreign substrate (8) (FIG. 1G) in order to possibly re-use the original substrate (3).

FIG. 1 [A-B-D-F-H] represents a similar process according to the prior art wherein the preparation of a porous silicon layer (10, double layer 1+2) on a substrate (3) (FIG. 1A) is followed by an epitaxial silicon layer (7) deposition (FIG. 1B), the device (11) fabrication, which is not yet contacted, on said substrate, the separation of said device (11) from the substrate (3) (FIG. 1D), and the transfer to a foreign substrate (8) (FIG. 1F) in order to possibly re-use the original substrate (3). The contacts (6) of the device (11) are then formed after the bonding on the foreign substrate (8) (FIG. 1H).

FIG. 2 illustrates an exemplary method for manufacturing a solar cell. The method comprises the formation of a porous semiconductor layer (double layer 1+2, step I) in the form of a thin-film (10) on an original substrate (3), the formation being immediately followed by the separation of the thin-film (10) by a lift-off process from the original substrate (3) (step J), transfer of the thin film (10) to a dummy substrate or support (4, step K), and the preparation of the device (11) including epitaxial silicon layer (7) deposition and, in certain embodiments, contact (6) fabrication (step L). Finally, the whole device (11) is transferred to a foreign substrate (8) in order to realize the solar cell (step M). In one embodiment, contact (6) fabrication can take place after transfer of a non-finished device to the foreign substrate (8).

Figure 3:
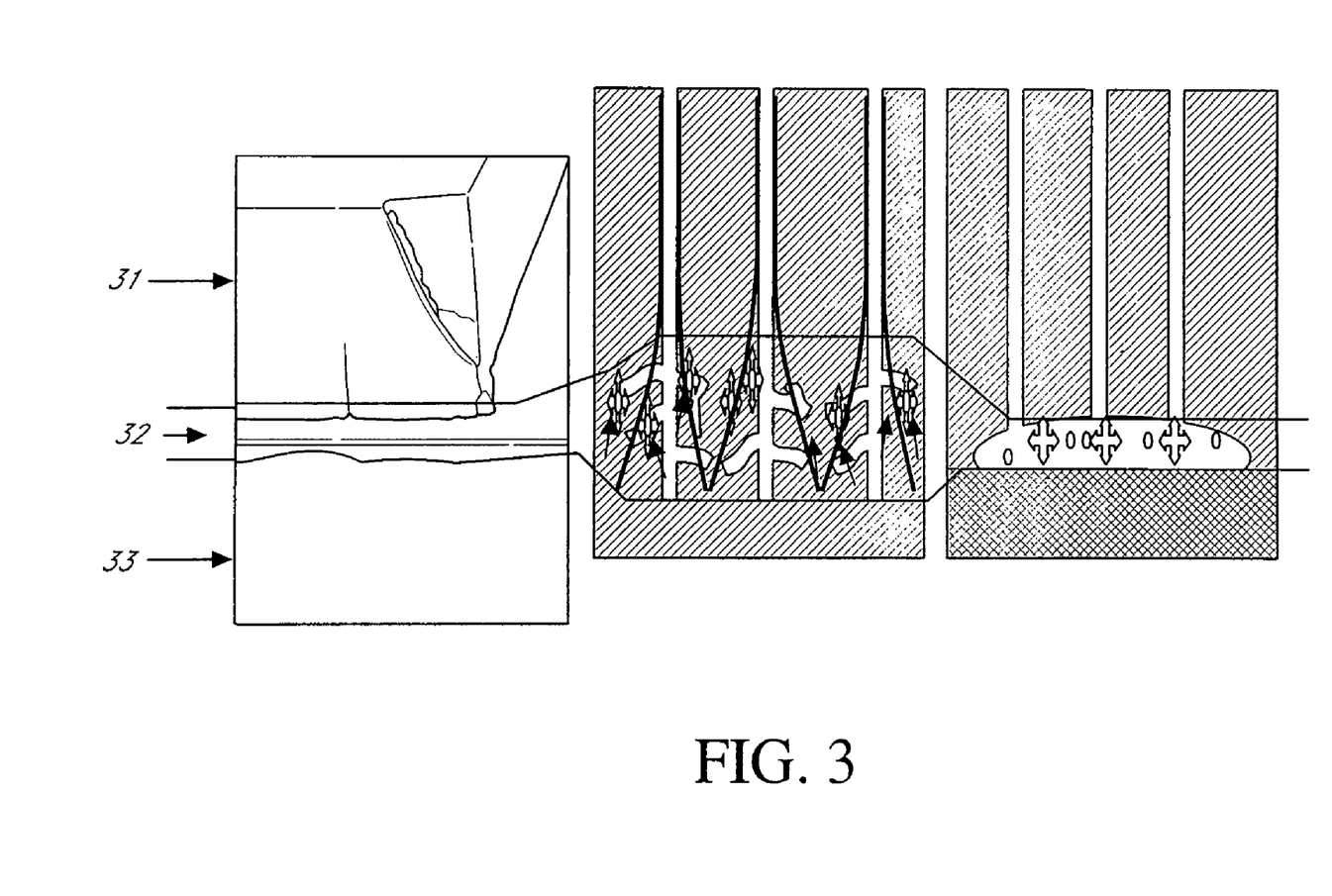
FIG. 3 illustrates the process of porous film production where pore branching results in increased lateral porosity followed by the film separation (lift-off process). This process is described in detail in EP-A-1132952.

The preferred lift-off process involving the film separation from its substrate is described in details in FIG. (3). Other lift-off or peeling-off processes are well-known in the art.

The pore formation according to this preferred lift-off process starts at a certain position, it goes straight down in the semiconductors as shown in FIG. 3 (zone 31). When the pores are not deep enough, the reaction occurs at the bottom of the pore. At this time, there are sufficient fluoride ions available at the bottom but certainly less than the number of fluoride ions available at the surface since they have to diffuse through the pore to the point of reaction. Porosity of the layer increases as in the concentration of HF in solution decreases. Although the initial F-containing solution is not replaced, an in-situ change of concentration is obtained. Therefore, as we go deeper, porosity of the layer increases. The porosity gradient occurs from the point where the availability of the fluoride ion is affected by the diffusion through the pores.

As pores go sufficiently deep in silicon, the fluoride ion concentration at the point of reaction reduces to a very low level as compared to the surface concentration. This results in the shift of the point of reaction to a slightly higher level because of very high resistance of the lowest part of the pore. This shift in the reaction gives rise to the formation of the branches of the pores (zone 32). For every dissolution of a silicon atom, one hydrogen molecule results as a product of the electrochemical etching. The hydrogen molecules exert force on the walls of the pores. At some points, because of the branching of pores, the walls become very thin and not able to withstand the hydrodynamic pressure exerted by the hydrogen molecules. This results in horizontal cracks in the layer. The presence of sufficient horizontal cracks results in the separation of the layer from the substrate (zone 33).

Figure 4:
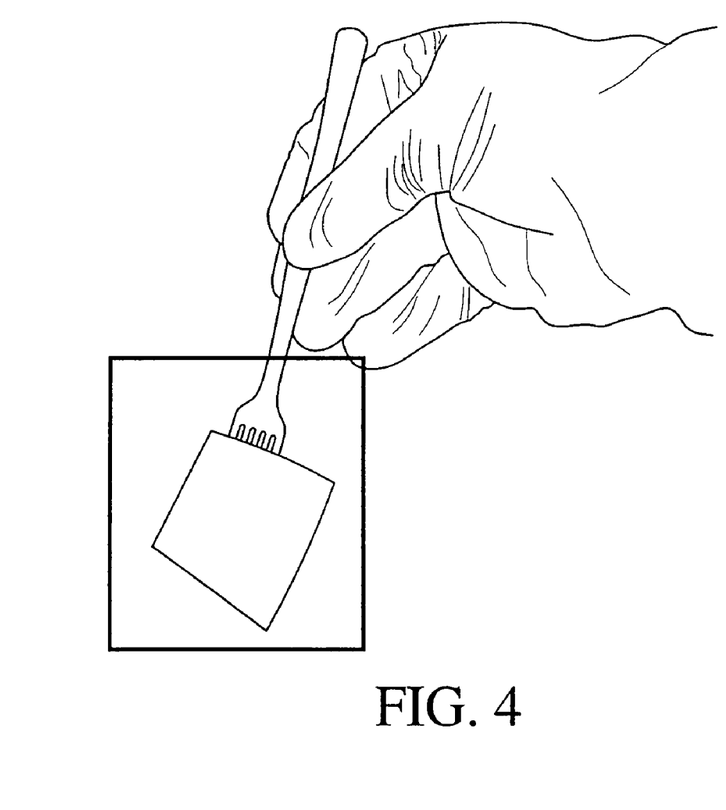
FIG. 4 is a picture of the free-standing thin film device after peeling and before the transfer to the support. The transfer can be done, e.g., manually as shown.

An example of a free-standing thin film is described in FIG. 4 after the peeling-off and before the transfer to a support. The transfer can be performed manually, as shown. Alternatively the transfer can be performed with a device that holds the thin film by suction.

The systems and methods described herein increase possibilities in the formation of porous layers in form of thin films by proposing a new sequence for the preparation of free standing thin-film devices to be used for SOI structures, such as solar cells, for example. Examples of such porous semiconductor layers called hereunder as PSL could be crystalline and amorphous semiconductor material including silicon, germanium, III–V materials such as Ga As, InGaAs and semiconducting polymers.

In conventional techniques a double porosity layer is prepared by electrochemical etching and by changing one of the formation parameters such as the electrolytic current density or the HF concentration of the electrolytic solution.

The parameters of the porous silicon formation can also remain unchanged such that the separation is reached by allowing the current to flow for a sufficient amount of time (see EP-A-1132952).

An example of a preferred set-up used for the formation of the double porous semiconductor layers is described below with reference to FIG. 5.

Figure 5:
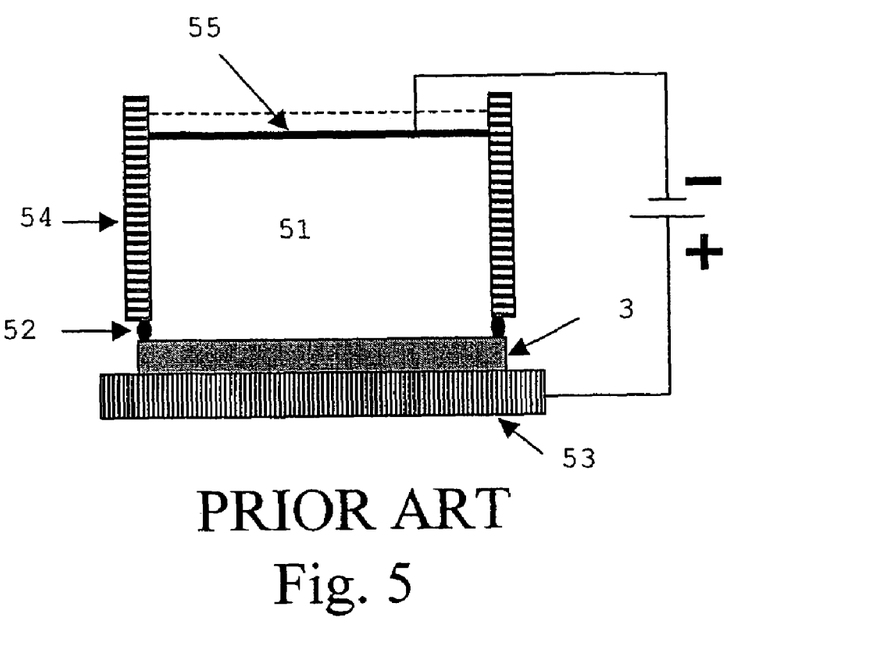
FIG. 5 represents the set-up used for the porous semiconductor layer formation according to EP-A-1132952.

FIG. 5 illustrates an exemplary set-up used for the formation of the porous semiconductor layer (PSL). In FIG. 5, the platinum electrode (55), which is resistant against hydrofluoric acid, acts as a negative electrode. The bottom plate (53) (e.g., stainless steel plate), which is in contact with the silicon wafer (3) (polished side up), acts as a cathode. The rubber ring (52) prevents the outflow of the solution from the contact area of the Teflon® beaker (54) and wafer substrate (3). The rubber ring is kept under pressure by the beaker (54), which in turn is pressurized by a stainless steel threaded ring (not shown). In one embodiment the setup also comprises an etching solution (51).

According to the process of the present invention, after the preparation of the porous silicon layer, the film obtained is immediately separated from the substrate by one or more processes and then the fabrication of the device for the solar cell is carried out without permanently transferring the film on other substrates. This makes the process very simple because under these conditions, no worry is justified about the foreign substrate as well as original substrate and glues on which the film has to be transferred. At the same time this gives a full freedom of process parameters. Since there is no limitation due to the foreign substrate and due to porosity of the semiconductor layer, any temperature cycle can be used.

In an advantageous embodiment, full control of the process of separating the porous silicon layer is possible, ) avoiding potential nuisances known to occur with certain prior art methods. For instance, if the porosity of the high porosity layer (2) is not high enough, separation after epitaxial deposition on the thin film in accordance with such prior art method may not be possible so that the lift-off process becomes unsuccessful. If the porosity of the high porosity layer is too high then it may separate unwantedly during the epitaxial layer deposition In an advantageous embodiment, the formation and lift-off of porous layers (steps (a) and (b)) are similar to the method described in EP-A-1132952 and circumvents the above-described problems.

With the method according to the present invention there is also no limitation on the epitaxial layer deposition temperature which in prior art cases can be limited due to thermal stability of the high-porosity layer and/or on the thermal stability of the substrate and glue.

Since the film is not physically attached to any substrate during epitaxy and cell fabrication, there are no concerns about the physical and chemical properties of any foreign substrate and/or glue and the impact of processing steps on these properties.

It has been shown that the growth of an epitaxial layer (7) on a porous thin film, which is attached, for instance glued on a substrate (e.g., dummy substrate), is not obvious, due to the impact on the glue of, for instance, the high temperatures used. (typically 1050° C.).

Both sides of the epitaxial layer are available during the complete cell fabrication process so there is more freedom of cell design and processing.

Figure 6:
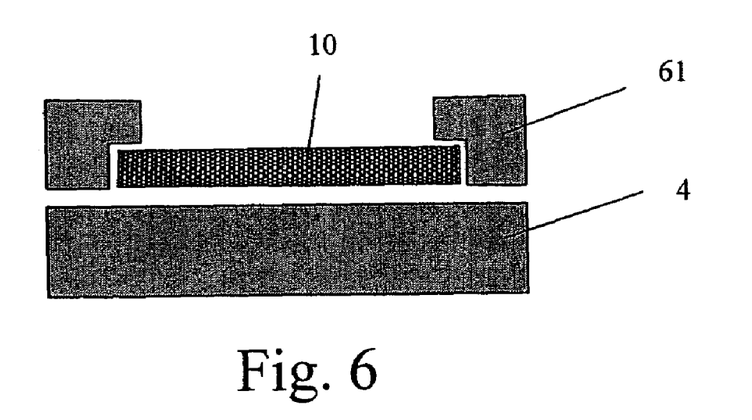
FIG. 6 is representing the dummy substrate to hold the porous semiconductor film during the epitaxial layer deposition. The porous film is not attached or physically bonded to the dummy substrate.

Preferably the fabrication of the device itself is performed by transferring the lift-off film (10) to a dummy support (4) in order to realize the epitaxial deposition (FIG. 6). The film can be clamped by for instance clamps (61). The dummy substrate can be any substrate that provides the necessary support during device fabrication and/or allows freedom of process parameters and/or does not interact with the thin film in a way that the latter would become bonded to the dummy support during said device fabrication. It is preferably resisting high temperatures (e.g., 1050° C.). It is preferably inert to process steps which are performed during device fabrication while positioned on the dummy substrate. In a preferred embodiment of the invention the dummy substrate is a silicon substrate or a quartz substrate In a preferred embodiment according to the invention, the dummy support may be re-used.

The present invention discloses a very attractive method for the preparation of low-cost, high quality structures, such as SOI structures or solar cells. The method according to the present invention clearly has many advantages over methods presently known in the art.

Figure 7:
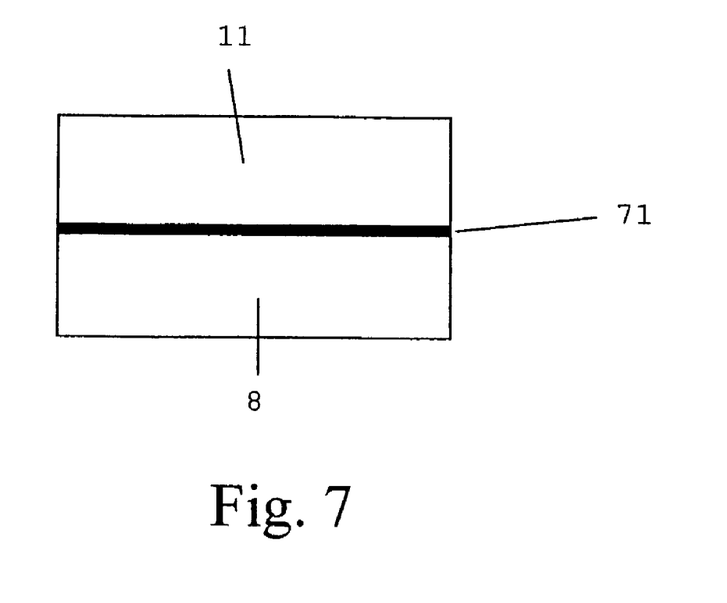
FIG. 7 represents an adhesived device on a foreign substrate.

FIG. 7 illustrates an exemplary final structure, such as a solar cell, whereon the active device (11) has been attached by an adhesive (71) on a low-cost substrate (8).

According to a preferred embodiment related to the solar cell manufacturing process, the processing is more simple and provides a total freedom in terms of processing parameters, compared to the conventional techniques, e.g., using porous silicon sacrificial layers for thin film transfer processes. The transfer process according to the present invention occurs directly after the preparation of the porous silicon film on a dummy substrate which makes an intermediate layer as in the prior art useless. Such intermediate layers (e.g., hydrogen silsequioxane) require high temperature stability (1100° C.) and matching thermal expansion coefficients as well as low impurity contents. For the substrate, similar requirements are necessary. Contrary thereto, for the process of the present invention, no transfer to the real substrate is performed and therefore no intermediate layer is used. The handling of the thin layer (film) is the biggest challenge but this difficulty is compensated by fewer constraints due to the reduced number of layers and more freedom in terms of process parameters. The monocrystalline Si thin film solar cells can be attached to any substrate (even flexible substrates) and the handling of this film remains the most critical point.

Aspects of the present invention include a high quality method which allows production of a thin semiconductor film comprising a porous layer and a high quality epitaxial layer on top of said porous layer, and transfer it onto a foreign substrate. The resulting device can be used in a number of applications including, but not limited to, the following:

terrestrial solar cells, due to their low-cost, space solar cells due to their light weight (thin-film) combined with high efficiency, SOI structures due to their high quality of the epitaxial layers.

The following example is offered by way of illustration, not by way of limitation.

EXAMPLES

Example 1

Fabrication of Solar Cells

A 20 μm porous silicon film is separated from highly doped P-type, <100> silicon by electrochemical etching in an electrolyte bath containing HF. After annealing of a porous silicon film at 1050° C. in $H_2$, P-type silicon layer with 20 μm thickness is deposited using conventional Chemical Vapor Deposition (CVD). In the first trial, a simple two side-contacted solar cell without any photolithography is applied for such free-standing film. An efficiency of 10.6% is achieved for a small area cell (1 cm$^2$). The other cell parameters are as follows: $V_{oc}$–581.3 mV, $I_{sc}$–30.29 mA/cm$^2$ and FF–60.1%. Internal Quantum Efficiency (IQE) analysis reveals that the spectral response of free-standing film with Al backside metallization is significantly increased in the infrared wavelength region as compared to the cell transferred to conventional ceramic substrates.

The process of the present invention comprises the following four steps of fabrication:

a) Porous Silicon Formation and Separation from the Reusable (Original) Substrate. (See also EP-A-1132952)

For all experiments highly boron doped p-type monocrystalline CZ-Si substrates with a resistivity in the range of 0.02–0.05 Ω-cm and an area of 5×5 cm$^2$ are used. Porous silicon formation is carried out in a conventional PTFE (Teflon) cell with a silicon sample as anode and a platinum counter electrode as shown in FIG. 5. The electrolyte contained of HF and acetic acid is used. Porous silicon formation is carried out at current density ranging from 50 to 250 mA/cm$^2$ and HF concentration ranging from 12 to 35 vol % at room temperature under background illumination.

b) Transfer of the Porous Semiconductor Layer to a Dummy Substrate.

The porous semiconductor layer is not attached or physically bonded to the dummy substrate but fixed in between two supports to give mechanical strength to the porous semiconductor layer. Therefore we call it 'free-standing film' or 'free-standing solar cell'.

c) Device Fabrication.

E.g., epitaxial silicon layer deposition: deposition of active layer can be carried out with and without pre-annealing of porous layer in $H_2$ ambient at 1050° C. for 30 min. In the first case, the aim is to convert the porous silicon into quasi monocrystalline silicone (QMS) which provides a good seeding layer for a CVD layer deposition. An active layer of 10–30 microns is deposited using dichlorosilane (DCS) or trichlorosilane (TCS) at 1050° C. and 1130° C. respectively. The porous silicon film is kept (no permanent bonding) between two silicon substrates, with the window on the top substrate for CVD deposition.

One side contacted and two side contacted solar cells are fabricated while keeping the Porous-Silicon+Epi essentially free-standing (no permanent bonding to any substrate). Efficiency of 10.6% has been achieved on 1 cm$^2$ area.

d) Attach or Transfer Solar Cell on Foreign Substrate.

In the final step of fabrication solar cell is transferred to a foreign substrate like Glass, Plastic, etc., using some adhesive as for instance glue.

What is claimed is:

1. A method of manufacturing a semiconductor device, the method comprising:
   (a) forming a porous semiconductor layer in the form of a thin film on an original substrate, the forming being immediately followed by
   (b) separating the thin film by a lift-off process from the original substrate;
   (c) transferring the thin film to a dummy support, the thin film not being attached to the dummy support;
   (d) fabricating a device on top of the thin film; and
   (e) attaching the thin film with the device fabricated on the thin film to a foreign substrate.

2. The method according to claim 1, wherein (c) and (d) are performed twice, such that the device is fabricated and attached on a first side of the thin film and a second device is fabricated and attached on a second side of the thin film.

3. The method according to claim 1, wherein the fabricating comprises at least the deposition of an active semiconductor layer on the thin film.

4. The method according to claim 3, wherein the deposition of the active semiconductor layer is performed by epitaxial Chemical Vapor Deposition.

5. The method according claim 1, wherein the transferred device is a non-finished device that is further finished after attachment to the foreign substrate.

6. The method according to claim 1, wherein the lift-off process is achieved by immersing the substrate in a HF solution in concentration between 12 and 35% and using current densities between 50 and 250 mA/cm$^2$ without changing any other parameters.

7. The method according to claim 1, wherein the porous semiconductor layer is a double layer of crystalline or amorphous semiconductor material including silicone germanium, III–V materials such as Ga As, InGaAs and semiconducting polymers.

8. The method according to claim 1, wherein the foreign substrate comprises a low-cost substrate.

9. A method of manufacturing a thin film device comprising:
   fabricating a device on a free-standing thin film; and
   depositing the thin film device on a substrate.

10. The method of claim 9, wherein the free-standing thin film is on an intermediate substrate during fabricating and the method further comprises removing the thin film device from the intermediate substrate.

11. The method of claim 9, wherein the thin film device is a solar cell.

12. The method of claim 9, wherein the substrate comprises glass.

13. A method of manufacturing a thin film device comprising:
   forming a thin film on an original substrate;
   separating the thin film from the original substrate;
   transferring the thin film to a dummy support so that the thin film is free-standing;
   forming an active layer on the thin film; and
   attaching the active layer and the thin film to a foreign substrate.

14. The method of claim 13, wherein attaching comprises bonding the active layer and the thin film to the foreign substrate.

15. The method of claim 13, wherein forming of the active layer is performed using chemical vapor deposition.

* * * * *